(12) United States Patent
Yoshida et al.

(10) Patent No.: US 7,326,310 B2
(45) Date of Patent: Feb. 5, 2008

(54) METHOD FOR MANUFACTURING CERAMIC GREEN SHEET AND METHOD FOR MANUFACTURING ELECTRONIC PART USING THAT CERAMIC GREEN SHEET

(75) Inventors: Masayuki Yoshida, Tokyo (JP); Junichi Sutoh, Tokyo (JP); Shunji Aoki, Tokyo (JP); Genichi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/926,033

(22) Filed: Aug. 26, 2004

(65) Prior Publication Data

US 2005/0045268 A1   Mar. 3, 2005

(30) Foreign Application Priority Data

Aug. 28, 2003  (JP) .............................. 2003-304213

(51) Int. Cl.
  *B32B 37/00*  (2006.01)
  *B32B 38/00*  (2006.01)
  *H01F 41/00*  (2006.01)
  *H01G 13/00*  (2006.01)

(52) U.S. Cl. ................................ 156/89.11; 156/89.12; 156/272.2; 430/311; 430/322

(58) Field of Classification Search ............. 156/89.11, 156/89.12, 89.16, 275.5; 264/430; 430/311
See application file for complete search history.

(56) References Cited

U.S. PATENT DOCUMENTS 3,502,520 A * 3/1970 Schwartz .................... 430/198
4,912,019 A * 3/1990 Nebe et al. .............. 430/281.1
6,004,705 A * 12/1999 Masaki et al. ................ 430/15
6,159,322 A * 12/2000 Ogata et al. ................ 156/230
6,342,322 B1 * 1/2002 Kakinuma et al. ............ 430/17
6,602,766 B2 * 8/2003 Chang et al. ............... 438/496
6,790,596 B2 * 9/2004 Kubota et al. ........... 430/281.1

(Continued)

FOREIGN PATENT DOCUMENTS

EP     0 589 241     * 3/1994

(Continued)

OTHER PUBLICATIONS

U.S. Appl. No. 10/543,710, Yoshida et al.

*Primary Examiner*—Melvin Mayes
(74) *Attorney, Agent, or Firm*—Oblon, Spivak, McClelland, Maier & Neustadt, P.C.

(57) ABSTRACT

The invention relates to a so-called ceramic green sheet used for manufacturing multilayer ceramic electronic parts. The invention is directed to formation of an insulating layer or a like layer having a complex shape with concavities and convexities while maintaining accuracy in its shape, accuracy in its formation position and uniformity in its thickness. In a process according to the invention, a layer made of a photosensitive material including a powder having a desired electric characteristic is formed on a light transmissive base member. Light such as ultraviolet light having a first pattern is radiated to the photosensitive material from the back side of the base member and light such as ultraviolet light having a second pattern is radiated to the photosensitive material from the back side of the base member so that the photosensitive material is exposed. Then the photosensitive layer after the exposure is subjected to development.

7 Claims, 5 Drawing Sheets

U.S. PATENT DOCUMENTS

| | | | |
|---|---|---|---|
| 2002/0022141 A1* | 2/2002 | Nakamura et al. | 428/480 |
| 2005/0045268 A1 | 3/2005 | Yoshida et al. | |
| 2005/0048415 A1* | 3/2005 | Yoshida et al. | 430/322 |
| 2005/0079450 A1* | 4/2005 | Yoshida et al. | 430/322 |

FOREIGN PATENT DOCUMENTS

| | | | |
|---|---|---|---|
| JP | 47-6704 | | 4/1972 |
| JP | 04-215414 | | 8/1992 |
| JP | 5-114531 | * | 5/1993 |
| JP | 5-190367 | | 7/1993 |
| JP | 08-023102 | | 1/1996 |
| JP | 09-115766 | | 5/1997 |
| JP | 9-227703 | * | 9/1997 |
| JP | 10-229016 | | 8/1998 |
| JP | 11-233943 | * | 8/1999 |
| JP | 11-330658 | | 11/1999 |
| JP | 2001-085264 | | 3/2001 |
| JP | 2001-110662 | | 4/2001 |
| JP | 2002-026046 | | 1/2002 |
| JP | 2002-184648 | | 6/2002 |
| JP | 2002-221801 | | 8/2002 |
| JP | 2003-29415 | | 1/2003 |
| JP | 2003-048303 | | 2/2003 |
| JP | 2003-241199 | | 8/2003 |

* cited by examiner

METHOD FOR MANUFACTURING CERAMIC GREEN SHEET AND METHOD FOR MANUFACTURING ELECTRONIC PART USING THAT CERAMIC GREEN SHEET

BACKGROUND OF THE INVENTION

1. Field of the Invention

The present invention relates to a method for manufacturing an electronic part, especially an electronic part that is formed by laminating ceramic layers, which is exemplified by a so-called multilayer ceramic electronic part. The present invention also relates to a method for manufacturing a so-called ceramic green sheet used in the aforementioned method. Examples of the multilayer ceramic electronic part mentioned here include multilayer ceramic capacitors, multilayer ceramic inductors, LC composite parts including capacitors and inductors formed therein, or EMC related parts etc.

2. Related Background Art

In recent years, with downsizing and rapid popularization of electronic apparatuses represented by cellular phones, an increase in mounting density of the electronic parts used for those apparatuses and improvement in their performance are required. Especially, demands for downsizing, decrease in thickness, increase in the number of layers and uniformization of each layer are placed on multilayer ceramic electronic parts that are used as passive elements in order to meet the above requirements. In addition, development of the manufacturing method that can meet those requirements is also demanded.

So called metal-ceramic combined baking, disclosed in, for example. Japanese Patent Application Laid-Open No. 2001-110662 and Japanese Patent Application Laid-Open No. 2001-85264, is a conventional manufacturing method used for manufacturing the aforementioned multilayer ceramic electronic parts exemplified by multilayer ceramic capacitors having electrodes formed in the interior thereof, which can meet the aforementioned requirements. Here, this metal-ceramic combined baking technology will be described briefly. In this technology, a plurality of electrodes are formed on a so-called ceramic green sheet at the same time using an electrically conductive paste composed of a metal powder and an organic binder material.

Subsequently, a plurality of simple ceramic green sheets and ceramic green sheets on which electrodes have been formed etc. are stacked to form a ceramic multilayer member. The electrodes will constitute the internal electrodes of a multilayer ceramic electronic part when it is finished. In addition, the ceramic multilayer member is pressed in its thickness direction so that the green sheets will be brought into close contact with each other. The multilayer member brought into close contact is cut into a certain size and separated so as to be subjected to baking. On the outer surface of the baked member thus obtained, external electrodes are form fitted. Thus, a multilayer ceramic electronic part is obtained.

In recent years, further downsizing and thickness reduction of the aforementioned multilayer ceramic electronic parts have been required, and it is necessary to reduce the thickness of dielectric layers made of a ceramic or the like sandwiched between internal electrodes. Therefore, it is required to perform the above-described process while further reducing the thickness of ceramic green sheets that constitutes the ceramic multilayer member. In view of these requirements, the thickness of the thinnest ceramic green sheet presently used is about 2 to 3 μm. In addition, the thickness of electrodes printed on the ceramic green sheets is about 1.5 to 2.0 μm.

The thickness of the ceramic green sheets and the electrodes formed on the surface thereof, the width and pattern shape of the electrodes, are substantially determined at the time when they are formed, and it is practically impossible to add a process of shaping them after they are formed. Conventionally, the electrodes or the like are formed by screen printing. In the screen printing, variations in the thickness in the formed area is ±10 to 20%, and the limit value of the pattern width that can be formed is considered to be about 50 μm. As disclosed in Japanese Patent Application Laid-Open No. 2002-184648, on the surface of a sheet produced by the screen printing, there is unevenness like an impression of a mesh. In view of this, a new production method is required to be devised in order to produce sheets having improved uniformity in thickness and improved surface evenness.

As one solution, there has been proposed a technology in which a sheet or layer having a desired thickness is formed by a ceramic slurry having photosensitivity or an electrode paste having photosensitivity, so that they are subjected to exposure and development processing to produce electrodes or the like with high accuracy in terms of width and shape etc. With that method it is possible to make the pattern width thinner and the positional accuracy of pattern formation can also be enhanced as compared to the printing process. However, in the case that the layer to be exposed is formed by a printing process, there will be the aforementioned unevenness of the layer surface, and the unevenness will remain unchanged even when ordinary exposure and development processing has been applied.

It may be possible to reduce the unevenness by applying mechanical processing such as pressing to the sheet or the layer after the sheet or the layer is formed. However, this is not desirable because the process will be lengthy. A method using a coater or spin coating process is another method for forming a sheet or a layer having no or reduced unevenness. However, on the surface of the layer obtained by the aforementioned coating process, there remains traces of a blade or the like and the variations in the thickness is ±3 to 5%, which still remains after the exposure and development processing. Therefore, in order to manufacture electronic parts having improved characteristics an improvement in the surface evenness or reduction of the variations in the thickness is required.

In the case that metal paste is applied on a base member by screen printing or using a coater to form an electrode layer, sag of the edge portion of the electrode or deterioration in straightness of the edge portion can occur depending on conditions such as viscosity of the metal paste etc. In addition, a run-over or faded portion can be generated upon application of slurry, which can cause short-circuit or conduction failure when assembled into an electronic part. Furthermore, upon reducing the coating thickness, there is the lower limit of the thickness of the coating that can be formed depending on various condition such as viscosity. Furthermore, it is difficult to reduce variations in the dimension in the thickness direction down to less than a few percent. This is also the case when a ceramic green sheet is produced using a ceramic slurry.

In the case of a ceramic green sheet that is used for forming an electronic part in the form of an inductor, a penetrating electrode or the like may be formed in some cases. In that case, it is desirable that the length of the penetrating electrode (or the thickness of the electrode) be controlled precisely in order to make electric characteristics of the inductor definite. However, at present, the thickness of the electrode is determined in accordance with the thickness of the ceramic sheet and it is practically difficult to control the thickness of the electrode independently from the thickness of the ceramic green sheet, as will be seen from Japanese Patent Application Laid-Open No. 2003-48303.

In addition, when for example an inductor or the like is to be manufactured, it is necessary to pattern an electrode or other parts into a complicated shape with respect to a planer direction. Screen printing can attain accuracy in the complex patterning to some extent. However, it is difficult to further improve the characteristics of an electronic part by using screen printing. In addition, it is considered difficult as described above to form the cross section of the electrode or other parts in a desired shape.

Furthermore, when for example inductors or the like are to be manufactured, it is preferable to use a ceramic green sheet having a pattern electrode and a penetrating electrode in the same single sheet from the viewpoint of accuracy of lamination and downsizing or the parts. In this case, from the viewpoint of reduction of the number of the process steps and enhancement of characteristics of the inductors, it is considered preferable, if possible, to form concavities and convexities in a partial area of a layer made of an insulator and to fill the multiple concavities with an electrode paste to form a pattern electrode and a penetrating electrode. However, it is difficult for conventional technologies to form such concavities and convexities with a high degree of accuracy.

SUMMARY OF THE INVENTION

The present invention has been made in view of the above-described background and problems. An object of the present invention is to reduce variations in surface evenness or thickness of a ceramic green sheet or an electrode layer and to provide a method for forming a sheet and a layer having desired concavities and convexities. Another object of the present invention is to reduce variations in electric characteristics of multilayer ceramic electronic parts by the aforementioned method so as to provide electronic parts having improved electric characteristics.

In order to attain the above object, according to the present invention there is provided a method for manufacturing a ceramic green sheet utilizing an exposure process and an development process, comprising a step of attaching a photosensitive material including a powder having a specific electric characteristic to a front side surface of a member having a portion that can transmit light used in the exposure process, wherein the photosensitive material is sensitive to the light, and the front side surface is a surface on which a sheet is to be formed, a step of shaping the light into a first pattern and irradiating the photosensitive material with that light from the back side of the aforementioned member to perform the exposure process with such an exposure amount that only a portion of the photosensitive material that is within a first predetermined thickness will undergo the exposure, a step of shaping the light into a second pattern and irradiating the photosensitive material with that light from the back side of the aforementioned member to perform the exposure process with such an exposure amount that only a portion of the photosensitive material that is within a second predetermined thickness will undergo the exposure, and a step of performing the development process on the photosensitive material after the exposure process.

In the above-described manufacturing method, the whole area of the back side surface of the aforementioned member may be irradiated with the light having the first pattern. In addition, in the above-described manufacturing method, the light may be shaped into a predetermined pattern by passing through a mask disposed on the back side of the aforementioned member.

In order to attain the above object, according to another aspect of the present invention, there is provided a method for manufacturing a ceramic green sheet utilizing an exposure process and an development process, comprising a step of attaching a photosensitive material including a powder having a specific electric characteristic to a front side surface of a member having a portion that can transmit light used in the exposure process, the photosensitive material being sensitive to the light, and the front side surface being a surface on which a sheet is to be formed, a step of irradiating the photosensitive material with the light from the back side of the aforementioned member to perform the exposure process multiple times while controlling the exposure amount, wherein in at least once in the exposure process, the photosensitive material is irradiated with light having a predetermined pattern from the back side of the aforementioned member, and a step of performing the development process on the photosensitive material after the exposure process.

In the above-described manufacturing method, it is preferable that the light be shaped into a predetermined pattern by passing through a mask disposed on the back side of the aforementioned member. In addition, in the above-described manufacturing method, it is preferable that a concavity on a ceramic green sheet produced by performing the development process be filled with an electrically conductive material. Furthermore, in the above-described manufacturing method, it is preferable that a step of forming a light blocking portion composed of a material that does not transmit the light on a predetermined area of the front side surface of the aforementioned member be performed prior to the step of attaching the photosensitive material to the front side surface of the aforementioned member. Still further, in the above-described manufacturing method, it is preferable that a releasing processing be applied to the aforementioned member to facilitate release of the ceramic green sheet from the surface of the aforementioned member.

Furthermore, in order to attain the aforementioned object, a method for manufacturing a multilayer ceramic electronic part according to the present invention comprises a step of stacking a plurality of ceramic green sheets including a ceramic green sheet produced by any one of the above-described methods for manufacturing a ceramic green sheet, and a step of applying a pressure to the stacked ceramic green sheets in their thickness direction to form a laminated member.

According to the present invention, a layer formed by a conventional process of applying a photosensitive material for example using a coater or screen printing is processed through exposure and development so that reduction in variations of its position, shape and thickness can be realized. In addition, a complex processed shape having concavities and convexities can be formed. Therefore, it is possible to produce a sheet used for forming multilayer electronic parts having a more complex layer structure and improved quality as compared to conventional sheets only by adding the process according to the present invention to a conventional mass production process.

Furthermore, according to the present invention, it is possible to form a pattern shape and a through hole while controlling the layer thickness simultaneously. Consequently, upon forming a layer including a pattern or a through hole, it is possible to shape or process the layer with excellent accuracy in its shape and thickness. Thus, it is possible to manufacture a preferable sheet to be used for manufacturing multilayer electronic parts having a shape closer to an ideal shape than in conventional methods. More specifically, it is possible to produce a sheet having a pattern width of about 30 μm with variations in thickness of ±2-3% or less.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

An embodiment of a method of producing a sheet (i.e. a so-called ceramic green sheet) used in an electronic part manufacturing process according to the present invention will be described briefly. In this embodiment, a layer made of a photosensitive material containing powder having a desired electric characteristic is firstly formed on the surface of a base member that can transmit light such as ultraviolet light used in an exposure process that will be described later. The photosensitive material that constitutes the layer is sensitive to the aforementioned light such as ultraviolet light. Subsequently, light such as ultraviolet light having a first pattern is radiated to the back side of the base member so that the photosensitive material on the base member is exposed up to a first thickness (or depth). Furthermore, light such as ultraviolet light having a second pattern is radiated to the back side of the base member so that the photosensitive material is exposed up to a second thickness (or depth). After that, the photosensitive material that has been exposed is subjected to a development process, and then the base member is detached from the photosensitive material. Thus, a ceramic green sheet having a desired shape and thickness is obtained.

In the embodiments that will be described in the following, exposure of the photosensitive material with light such as ultraviolet light is performed twice. However, the present invention is not limited to this particular feature, but additional exposure using another mask may be further performed. Although the photosensitive material used in this embodiment is sensitive to light such as ultraviolet light, the light to be used is not limited to ultraviolet light as long as a specific light and a material that is sensitive to that light are used in combination. The aforementioned desired properties include, for example, electro-conductivity, permittivity and resistance. The method of attaching the photosensitive material to the base member is, for example, coating or printing, though the method is not limited to them. An example of the base member is a PET film that is transparent to light. A member on which releasing processing for facilitating release of a layer formed on the base member is applied may be used as the base member. A member on which a plurality of light transmissive layers are formed may be used as the base member. Upon patterning the ultraviolet light, a mask on which a predetermined pattern is formed may be used in such a way that the ultraviolet light is radiated to the back side of the base member through that mask. Although it is preferable that the aforementioned mask having a predetermined pattern be in close contact with the back surface of the base member, the mask may be disposed spaced apart from the back surface of the base member depending on the exposure condition or other conditions.

In this embodiment, the light used for the exposure process of the photosensitive layer is patterned through the mask disposed on the back side of the base member. However, the position of the mask is not limited to the back side of the base member. A light blocking part that functions in the same manner as the mask may be provided on the base member itself. Alternatively, a light blocking layer having the function same as the mask may be provided on the back side surface of the base member. In other words, the effect of the present invention can also be realized by providing a structure for patterning light in the base member side of the photosensitive material. In addition, the patterned light may be generated by scanning laser ray or the like in a desired pattern or using an area light source such as an LED panel composed of a dot matrix that can be patterned, to perform exposure process for the photosensitive material.

First Embodiment

Figure 1:
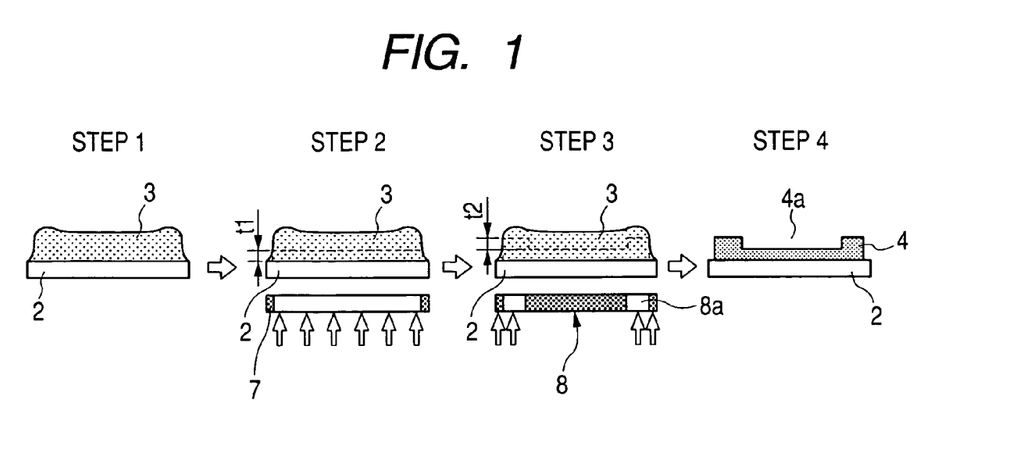
FIG. 1 is schematically shows a ceramic green sheet manufacturing process according to a first embodiment of the present invention.

A layer forming method according to the first embodiment of the present invention is illustrated in FIG. 1. FIG. 1 shows the cross sectional structure of layers or a sheet taken along the thickness direction in various stages of the process. The method according to this embodiment is intended to form an insulating layer having a specific thickness and shape. In the method according to this embodiment, a photosensitive layer 3 containing a powder having a desired electric characteristic is formed on a base member 2 made of a light transmissive film (e.g. a PET film) by coating (step 1). Next, in step 2, light such as ultraviolet light is radiated to the back side of the base member so that the photosensitive layer 3 is exposed. In that process, a mask 7 is disposed on the back side of the base member 2 so that only a predetermined area of the photosensitive layer 3 will be exposed.

In connection with the present invention, the applicant of the present patent application discovered the fact that the depth of the cured portion (or exposure amount) in the photosensitive layer 3 measured from the surface of the light transmissive member (in this case, the base member 2) can be controlled by controlling the intensity, radiation time or other factors concerning the ultraviolet light upon the exposure. In confirming the controllability of the thickness of the cured portion with the exposure amount, conditions such as the ratio of the ceramic powder mixed in a slurry, dispersibility of the powder, the average particle diameter of the powder, the transmittance of the powder were changed in various ways, and the thickness of the slurry that can be exposed was measured for each condition.

It is well known that when a material in which a ceramic powder or the like and a photosensitive binder are mixed (or kneaded) is exposed with light, diffusion of light generally occurs due to the presence of the ceramic powder or the like, so that the edge of the exposed portion is blurred. The applicant of the present patent application prepared mixtures in which a negative type binder and barium titanate powders having different average particle diameters of 1.0 μm, 0.8 μm, 0.6 μm, 0.4 μm and 0.2 μm respectively are mixed with a volume ratio of 1 to 1 and investigated the relationship between the irradiation time and the thickness of the film remaining after development. As a result, it was confirmed that in the case that the thickness of the remaining film is several microns, more specifically, for any powder, in the case that the thickness is about 10 μm or less, the exposure time and the thickness of the obtained sheet are in a linear relationship and variations in average film thickness values are in the range of ±0.5-2.0%. In addition, in order to keep flatness of the sheet, it can be said that smaller particle diameters are preferable. This depends on the thickness of the sheet, and in the smaller thickness range, the particle diameter is an important factor. Specifically, in the case that the sheet thickness is equal to or smaller than 5 μm, it is preferable to use barium titanate powder having an average particle diameter of equal to or smaller than 0.8 μm, and more preferably, equal to or smaller than 0.2 μm. In other words, a flat sheet can be obtained by using a slurry containing powder with an average particle diameter about one-fifth or less of the thickness of the sheet to be obtained. In addition, a sheet that is reduced in terms of the degree of its surface unevenness (in terms of arithmetic average roughness Ra) can be obtained by using a slurry containing powder with an average particle diameter about one-twentieth or less of the thickness of the sheet to be obtained. Here, the exposure time can be interpreted to the exposure amount taking into account the light intensity, and the result shows that the exposure amount and the thickness of the remaining film are in a linear relationship. Therefore, in the case that a ceramic powder and a photosensitive binder are used, when the thickness of the remaining film is about 5.0 Ξm as with the thickness of the electrode, it is possible to keep an accurate sheet thickness and evenness of the sheet surface. Although the description of a specific investigation has been made in connection with the case in which barium titanate powders which are inferior in light transmitting characteristics are used, we also investigated so-called glass ceramic powders which are superior in light transmitting characteristics, ferrite powders having light absorbing properties and metal powders. As a result, these powders also showed characteristics similar to the barium titanate powders, though the required exposure amount was different. Therefore, in the case that the thickness of the film remaining after development is to be controlled by adjusting exposure amount while using a slurry in which a metal or ceramic powder and a photosensitive binder are mixed, if the average particle diameter of the powder used is smaller than 1.0 μm, the surface roughness can be made small and a control process that can reduce variations in the average film thickness can be made possible. In addition, with experiments other than mentioned above, it was discovered that the thickness of the film remaining after development can be controlled in the range of about 50 μm or less, if conditions permit. In view of this discovery, in this embodiment, the exposure amount is controlled so that exposure will be effected up to the depth (or thickness) indicated by ti in FIG. 3. Furthermore, in step 3, a mask 8 on which a desired electrode pattern (light transmitting portion 8a) is disposed in close contact with the back side surface of the base member 2 and ultraviolet light is radiated to the photosensitive layer 3 through the mask 8 so that further exposure of the photosensitive layer 3 is performed. In step 3 also, the exposure amount is controlled so that the photosensitive layer 3 is further exposed by the thickness indicated by t2 in FIG. 3.

After the exposure, development is performed so that the portion of the photosensitive layer 3 other than the cured portion that have been exposed is removed. Thus an insulating layer (or dielectric layer) 4 with a concavity 4a having a specific shape and thickness is obtained as shown in step 4. As will be described later, the base member 2 is removed from the obtained sheet composed of the base member 2 and the insulating layer 4 as it is, or the base member 2 is removed from the sheet after an additional layer is formed thereon. Then, filling of the concavity 4a with the electrode material is performed, and the sheet from which the base member 2 has been removed is laminated with another sheet that has been made by the same process or a similar process, and formed into a multilayer electronic parts such as capacitors after undergoing various processes.

According to this embodiment, it is possible to make the surface of the cured portion even or flat while controlling the thickness (or depth) of the cured portion. As long as the base member 2 and the insulating layer 4 are transparent to light, this embodiment can be carried out only by adding the exposure process and the development process on top of the conventional coating or screen printing process.

In this embodiment, the shape and other factors of the electrode is determined by the mask pattern and the controlled exposure amount, and therefore the photosensitive layer may be applied by any existing process. However in order to reduce the removal amount in the development process, it is preferable that the thickness and other factors of the photosensitive layer 3 formed on the base member 2 be close to the size, shape and thickness of the electrode to be formed. In view of this, various methods including existing screen printing process or coating process using a blade may be used upon forming the photosensitive layer 3. Although in this embodiment the insulating layer 4 is formed directly on the base member 2, various layers that can transmit light may be formed between the insulating layer 4 and the base member 2. Furthermore, although this embodiment is directed to formation of the insulating layer 4, an electrode layer having concavity and convexity by using a powder having electrically conductive properties as the powder contained in the photosensitive material may also be formed. The order of performing the exposure processes shown in steps 2 and 3 is not limited to that which has been described in connection with this embodiment, but the order of performing those processes may be reversed.

Second Embodiment

Figure 2:
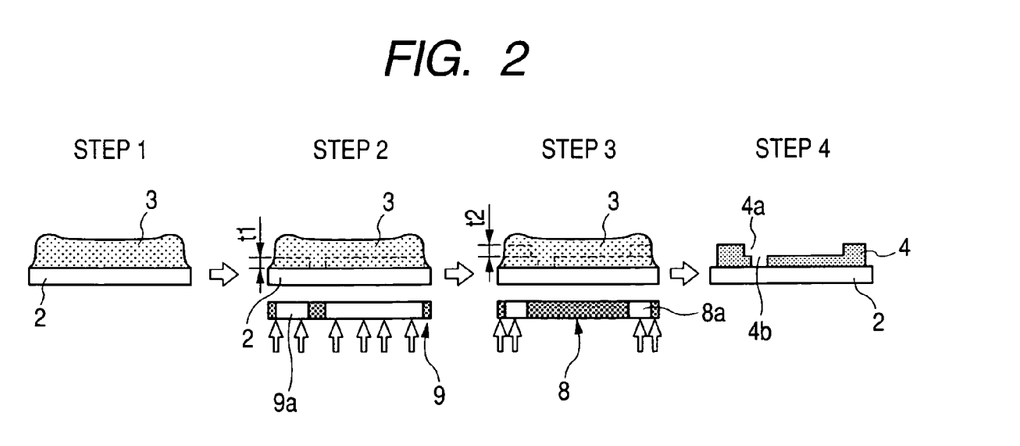
FIG. 2 is schematically shows a ceramic green sheet manufacturing process according to a second embodiment of the present invention.

FIG. 2 is a diagram similar to FIG. 1, which shows the cross sectional structure of layers or a sheet taken along the thickness direction in various stages of the process. The other drawing that will be referred to in the following shall also show the cross sectional structure of the sheet in various stages of a process. In this embodiment, a through hole is formed in an insulating layer 4. Specifically, a photosensitive layer 3 is formed on a light transmissive base member 2 made of for example PET film (step 1). Next in step 2, a mask 9 having a desired through hole pattern 9a is disposed in close contact with the back side surface of the base member 2 and ultraviolet light is radiated to its back side. In doing so, the exposure amount (or exposure dose) is controlled in such a way that the thickness of the cured portion of the photosensitive layer becomes t1.

After the exposure, the mask 9 is replaced by a mask 8 on which a desired electrode pattern (i.e. transparent portion 8a) is formed. The mask 8 is disposed in close contact with the back side surface of the base member 2. The electrode pattern of the mask 8 is formed in such a way as to overlap with the through hole pattern of the mask 9. In this state, ultraviolet light is radiated to the photosensitive layer 3 through the mask 8 so that the photosensitive layer 3 is exposed further (step 3). In step 3 also, the exposure amount is controlled in such a way that the photosensitive layer 3 is further exposed by the thickness indicated by t2 in FIG. 3. After the exposure, development is performed so that the portion of the photosensitive layer 3 other than the cured portion that have been exposed is removed. Thus, an insulating layer (or dielectric layer) 4 with a through hole 4b and a concavity 4a having a specific shape and thickness is obtained as shown in step 4. The order of performing the exposure processes shown in steps 2 and 3 is not limited to that which has been described in connection with this embodiment, but the order of performing those processes may be reversed.

Third Embodiment

Figure 3:
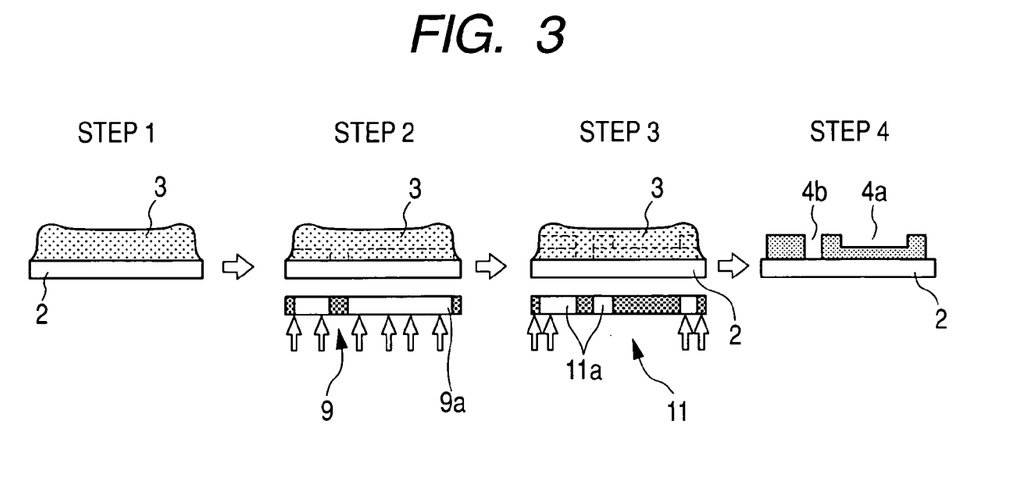
FIG. 3 is schematically shows a ceramic green sheet manufacturing process according to a third embodiment of the present invention.

In the embodiment shown in FIG. 3, a concavity 4a and a through hole 4b are formed on an insulating layer 4 independently from each other. This embodiment is different from the second embodiment in a mask 11 used in step 3. Specifically, in the mask 11, a pattern for forming a through hole and a pattern for forming an electrode are formed independently from each other without overlap. With use of the mask 9 and the mask 11, a concavity 4a and a through hole 4b are formed in the insulating layer 4 independently from each other. The order of performing the exposure processes shown in steps 2 and 3 is not limited to that which has been described in connection with this embodiment, but the order of performing those processes may be reversed.

By carrying out the present invention, it is possible to remove undesired portions such as sag or run-over that are generated when photosensitive material is applied on the surface of a base member or the like simply by keeping those portions unexposed. In addition, since it is not necessary to make the applied photosensitive material layer thin, faded portions will not be generated. In addition, according to the present invention, it is possible to control the thickness of the remaining layer precisely, by controlling the exposure amount. Thus, it is possible to form a layer with a thickness of, for example, smaller than 0.5 μm while reducing variations in thickness down to less than ±2 to 3%. Furthermore, it is possible to make the edge portion of a patterned shape obtained by the exposure and development more square in shape. Thus, it is possible to make variations of electric characteristics of electronic parts produced by laminating the sheets smaller than a desired value.

(Examples of Manufacturing Process of Electronic Parts Using a Sheet According to the Invention)

Figure 4:
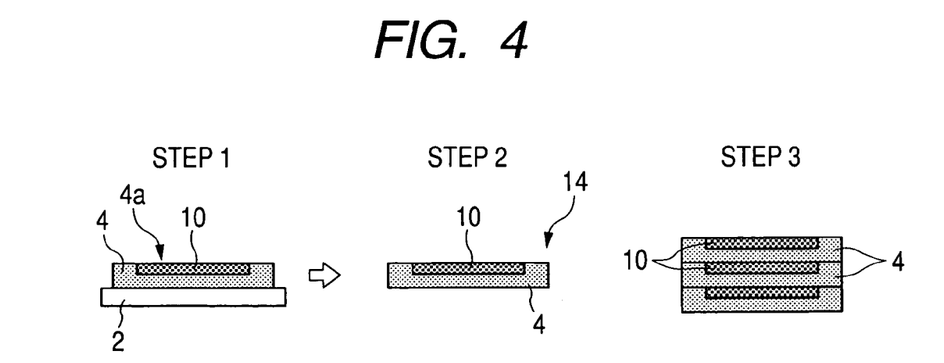
FIG. 4 schematically shows a process of actually manufacturing multilayer ceramic capacitors using a ceramic green sheet produced by a method according to the present invention.
Figure 5:
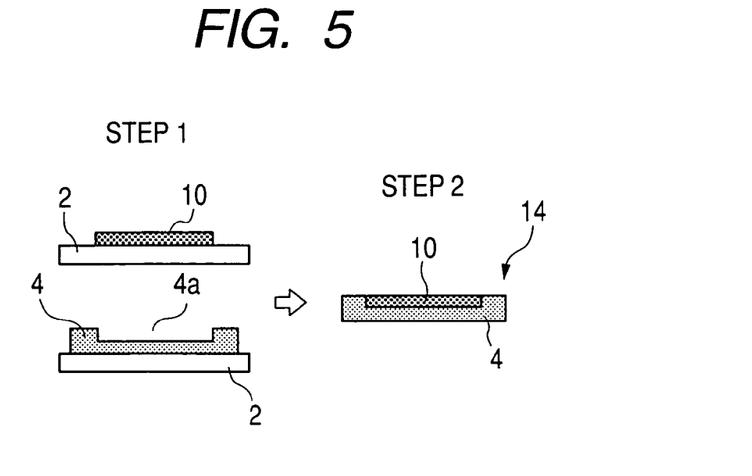
FIG. 5 schematically shows part of a process of actually manufacturing multilayer ceramic capacitors using a ceramic green sheet produced by a method according to the present invention.
Figure 6:
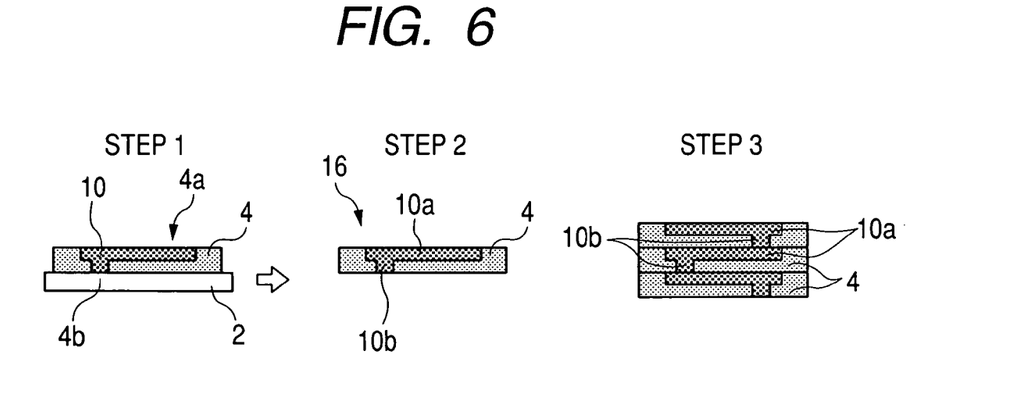
FIG. 6 schematically shows a process of actually manufacturing multilayer ceramic inductors using a ceramic green sheet produced by a method according to the present invention.
Figure 7:
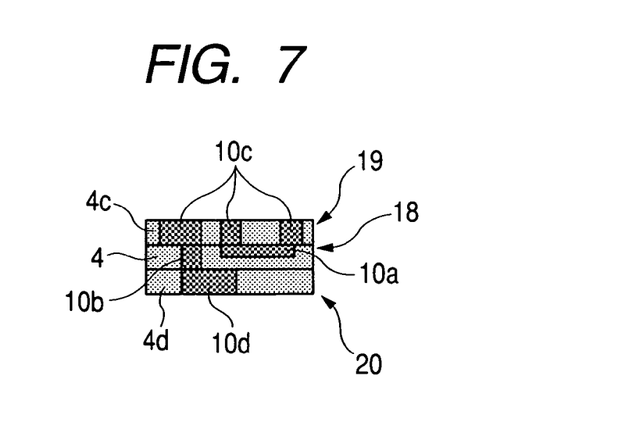
FIG. 7 schematically shows a process of manufacturing multilayer ceramic electronic parts having a more complex structure using a ceramic green sheet produced by a method according to the present invention.

In the following discussion, a process of manufacturing electronic parts using a sheet produced by the above-described sheet forming method according to the present invention will be described. FIGS. 4 to 7 that will be referred to in the description of the process show cross sections of a sheet or laminated sheets taken in the thickness direction as seen from the side. FIGS. 4 and 5 show various stages of a process of manufacturing multilayer ceramic capacitors. FIG. 6 shows various stages of a process of manufacturing multilayer ceramic inductors. FIG. 7 shows a process of manufacturing electronic parts having a more complex circuit structure.

FIG. 4 shows an example of a manufacturing process for producing ceramic capacitors using a sheet including an insulating layer 4 produced by the method according to the first embodiment. In this manufacturing process, firstly the concavity 4a of the insulating layer 4 formed on the base member 2 is filled with an electrode material 10 by, for example, screen printing (step 1). Next, the base member 2 is detached and removed from the insulating layer filled with the electrode material 10 (step 2). Then, a predetermined number of (three, in the example shown in FIG. 3) ceramic green sheets 14 having an electrode produced in this way are stacked (step 3).

A pressure is applied to the stacked sheets in the thickness direction to bring the sheets in pressure contact with each other. With this press process, the principal portion of the ceramic capacitor is formed. In this manufacturing process, the electrode material 10 fills the concavity 4a in such a way that the surface of the electrode material 10 is substantially coplanar with the surface of the convexity. Hence, the thickness of the ceramic green sheet 14 used for manufacturing capacitors is substantially uniform all over its area.

Therefore, it is possible to obtain a laminated member that can keep a shaped state well even with a small load pressure. Such a laminated member is cut into a specific size and subjected to baking, so that a desired multilayer ceramic capacitor is produced. With the use of the insulating layer 4 with reduced variations in surface evenness, shape and thickness produced by the method according to the present invention, it is possible to produce multilayer ceramic capacitors in which variations in a certain electric characteristic are small as compared to conventional multilayer ceramic capacitors.

Although in the above-described process, the concavity 4a is filled with the electrode material 10 using the screen printing, the ceramic green sheet for producing capacitors may be formed by combining a sheet produced by the method according to the first embodiment and an electrode obtained by using an electrically conductive material for the photosensitive material 3 in the first embodiment. When a ceramic green sheet 14 is produced by that method, the uniformity in the thickness of the sheet can be further enhanced.

FIG. 6 shows an example of a manufacturing process for producing ceramic inductors using a sheet including an insulating layer 4 produced by the method according to the second embodiment. In this manufacturing process, the concavity 4a and the through hole 4b of the insulating layer 4 formed on the base member 2 are filled with an electrode material 10 by, for example, screen printing (step 1). Next, the base member 2 is detached and removed from the insulating layer 4 having an internal electrode 10a and a penetrating electrode 10b produced by filling with the electrode material 10 (step 2). Then, a predetermined number of (three, in the example shown in FIG. 6) ceramic green sheets 16 having electrodes 10a and 10b produced in this way are stacked (step 3).

Pressure is applied to the stacked sheets in the thickness direction to bring the sheets in pressure contact with each other. With this press process, the principal portion of the ceramic capacitor is formed. In this manufacturing process, the electrode material 10 fills the concavity 4a in such a way that the surface of the electrode material 10 is substantially coplanar with the surface of the convexity. Hence, the thickness of the ceramic green sheet 14 used for manufacturing capacitors is substantially uniform all over its area.

Therefore, it is possible to obtain a laminated member that can keep a shaped state well even with a small load pressure. Such a laminated member is cut into a specific size and subjected to baking, so that a desired multilayer ceramic inductor is produced. With the use of the insulating layer 4 with reduced variations in surface evenness, shape and thickness produced by the method according to the present invention, it is possible to produce multilayer ceramic inductors in which variations in a certain electric characteristic are small as compared to conventional multilayer ceramic inductors. In connection with the above-described process, the ceramic green sheet used for producing inductors may be formed by the process shown in FIG. 5.

The cross section of the pattern electrode or other parts produced by the method of the present invention has a preferable square shape as compared to those produced by conventional methods, and therefore advantageous effects such as reduction of variations in the resistance of the inductor from a desired value or reduction of DC resistance are realized.

Figure 8:
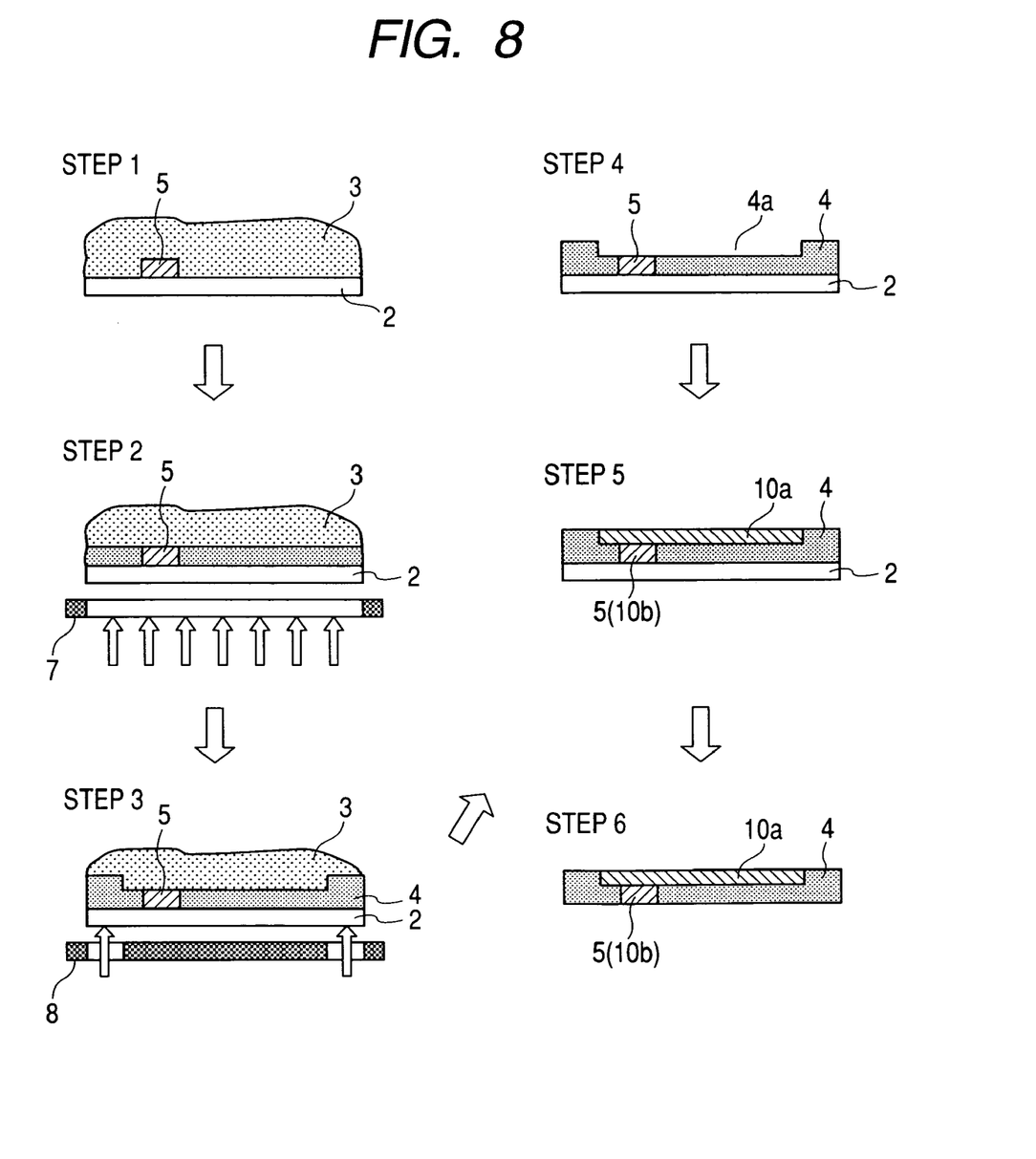
FIG. 8 schematically showing a ceramic green sheet manufacturing process according to another embodiment of the present invention, in which a light blocking layer is formed in advance.

The sheet shown in step 1 of FIG. 6 may be produced by a method according to another embodiment of the present invention shown in FIG. 8. FIG. 8 shows the cross section of a sheet, as is the case with the other drawings mentioned above, and parts similar to those in the structures shown in connection with the above-described embodiments will be designated by the same reference numerals. In the process of this embodiment, in step 1, a photosensitive layer 3 is formed on the top surface of the base member 2 and the light blocking layer 5 made of an electrode material formed at a predetermined position on the base member 2. The sheet as such is subjected to the process of steps 2-4 shown in FIG. 1 (which corresponds to steps 2-4 in FIG. 8). Thus, a sheet having a light blocking layer 5 and a continuous cavity 4a is produced. The concavity 4a is filled with an electrode material 10 by a certain process so that an internal electrode 10a continuous with the light blocking layer 5 (penetrating electrode 10b) is formed. The base member 2 is detached and removed from the sheet after the filling with the electrode material 10. Thus, a sheet used for forming inductors shown in step 6 is obtained. According to this method, since a penetrating electrode having a high aspect ratio for allowing connection between layers is formed in advance, it is considered that advantageous effects such as stability in the shape of the penetrating electrode or reliable connection of electrodes can be realized.

FIG. 7 shows a process of manufacturing multilayer ceramic electronic parts having a more complex circuit structure. The ceramic green sheet 18 shown in FIG. 7 is produced by filing the insulating layer 4 formed by the method according to the third embodiment with an electrode material by means of screen printing to form an internal electrode 10a and a penetrating electrode 10b independently from each other. Ceramic green sheet 19 is composed of an insulating layer 4c and an electrode 10c. Ceramic green sheet 20 is composed of an insulating layer 4d and an electrode 10d. The penetrating electrode 10b is provided to connect the internal electrode 10c and the internal electrode 10d of the ceramic green sheets 19 and 20 disposed on the top and bottom of the ceramic green sheet 18. The internal electrode 10a is insulated from the internal electrode 10d of the lower sheet 20 and connected with the internal electrode 10c of the upper sheet 19. By using the sheet produced by the method according to the present invention, electronic parts having the above-described structure can be manufactured easily.

Figure 9:
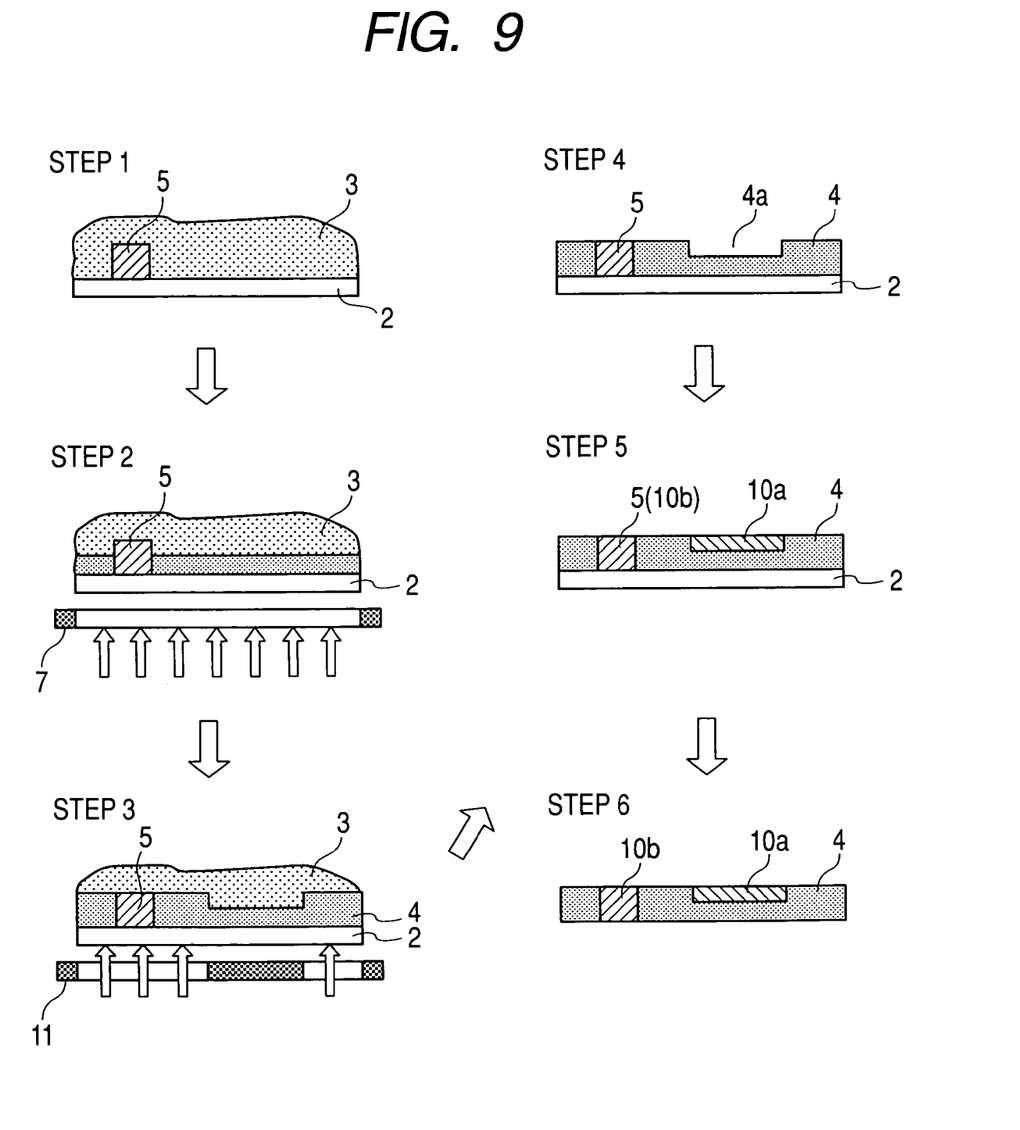
FIG. 9 schematically showing a ceramic green sheet manufacturing process according to still other embodiment of the present invention, in which a light blocking layer is formed in advance.

The sheet 18 shown in FIG. 7 may be produced by a method according to another embodiment of the present invention shown in FIG. 9. FIG. 9 shows the cross section of a sheet, as is the case with the other drawings mentioned above, and parts in FIG. 9 similar to those in the structures shown in connection with the above-described embodiments will be designated by the same reference numerals. In the process of this embodiment, in step 1, a photosensitive layer 3 is formed on the top surface of the base member 2 and the light blocking layer 5 made of an electrode material formed at a predetermined position on the base member 2. The sheet as such is subjected to the process of steps 2-4 shown in FIG. 2 (which corresponds to steps 2-4 in FIG. 9). Thus, a sheet having a concavity 4a is produced. The concavity 4a is filled with an electrode material 10 by a certain process so that an internal electrode 10a is formed. The base member 2 is detached and removed from the sheet after the filling with the electrode material 10. Thus, a sheet used for forming electronic parts shown in step 6 is obtained. According to this method, since a penetrating electrode having a high aspect ratio for allowing connection between layers is formed in advance, it is considered that advantageous effects such as stability in the shape of the penetrating electrode or reliable connection of electrodes can be realized.

This application claims priority from Japanese Patent Application No. 2003-304213 filed Aug. 28, 2003, which is hereby incorporated by reference herein.

What is claimed is:

1. A method for manufacturing a ceramic green sheet utilizing an exposure process and an development process, comprising the steps of:

attaching a photosensitive material including a powder having a specific electric characteristic to a front side surface of a member having a portion that can transmit light used in said exposure process, said photosensitive material being sensitive to said light, and said front side surface being a surface on which a sheet is to be formed;

shaping said light into a first pattern and irradiating said photosensitive material with that light from the back side of said member to perform said exposure process with such an exposure amount that only a portion of said photosensitive material that is within a first predetermined thickness will undergo the exposure;

shaping said light into a second pattern and irradiating said photosensitive material with that light from the back side of said member to perform said exposure process with such an exposure amount that only a portion of said photosensitive material that is within a second predetermined thickness will undergo the exposure;

performing said development process on said photosensitive material after said exposure process; and performing said exposure process only by irradiating said photosensitive material with said light from the back side of said member.

2. A manufacturing method according to claim 1, which comprises filling a concavity on a ceramic green sheet produced by performing said development process with an electrically conductive material.

3. A manufacturing method according to claim 1, further comprising forming a light blocking portion composed of a material that does not transmit said light on a predetermined area of the front side surface of said member, prior to said attaching said photosensitive material to the front side surface of said member.

4. A manufacturing method according to claim 1, which comprises applying a release facilitating processing to said member to facilitate release of said ceramic green sheet from the surface of said member.

5. A method for manufacturing a ceramic green sheet utilizing an exposure process and a development process, comprising the steps of:

attaching a photosensitive material including a powder having a specific electric characteristic to a front side surface of a member having a portion that can transmit light used in said exposure process, said photosensitive material being sensitive to said light, and said front side surface being a surface on which a sheet is to be formed;

irradiating said photosensitive material with said light from the back side of said member to perform said exposure process multiple times while controlling the exposure amount, wherein at least once in said exposure process, said photosensitive material is irradiated with light having a predetermined pattern from the back side of said member, and at least once in said exposure process, said photosensitive material is irradiated with light having a pattern which is different from said predetermined pattern from the back side of said member;

performing said development process on said photosensitive material after said exposure process; and performing said exposure process only by irradiating said photosensitive material with said light from the back side of said member including, producing a concavity on a ceramic green sheet by performing said development process, and filling the concavity with an electrically conductive material.

6. A method for manufacturing a ceramic green sheet utilizing an exposure process and a development process, comprising the steps of:

forming a light blocking portion composed of a material that does not transmit said light on a predetermined area of a front side surface of a member having a portion that can transmit light used in said exposure process;

attaching a photosensitive material including a powder having a specific electric characteristic to the front side surface of the member, said photosensitive material being sensitive to said light, wherein said front side surface comprises a surface on which a sheet is to be formed;

irradiating said photosensitive material with said light from the back side of said member to perform said exposure process multiple times while controlling the exposure amount, wherein at least once in said exposure process, said photosensitive material is irradiated with light having a predetermined pattern from the back side of said member;

performing said development process on said photosensitive material after said exposure process; and performing said exposure process only by irradiating said photosensitive material with said light from the back side of said member.

7. A method for manufacturing a multilayer ceramic electronic part comprising the steps of:

stacking a plurality of ceramic green sheets including a ceramic green sheet produced by a method for manufacturing a ceramic green sheet according to any one of claims 1, 5, 6, 2, 3, and 4; and applying a pressure to said stacked ceramic green sheets in their thickness direction to form a laminated member.

* * * * *